US012613264B2

(12) United States Patent
Bucklew et al.

(10) Patent No.: US 12,613,264 B2
(45) Date of Patent: Apr. 28, 2026

(54) RYDBERG SENSOR HAVING AN OPTICAL FIBER PATH FEEDING RYDBERG SENSING REGIONS AND ASSOCIATED METHODS

(71) Applicant: Eagle Technology, LLC, Melbourne, FL (US)

(72) Inventors: Victor G. Bucklew, Richmond, VA (US); James Drakes, Occoquan, VA (US); Samuel H. Knarr, Melbourne, FL (US); Dennis Estrada, Palm Bay, FL (US)

(73) Assignee: EAGLE TECHNOLOGY, LLC, Melbourne, FL (US)

( * ) Notice: Subject to any disclaimer, the term of this patent is extended or adjusted under 35 U.S.C. 154(b) by 279 days.

(21) Appl. No.: 18/415,719

(22) Filed: Jan. 18, 2024

(65) Prior Publication Data

US 2025/0237686 A1     Jul. 24, 2025

(51) Int. Cl.
*G01R 29/08*          (2006.01)
(52) U.S. Cl.
CPC ................................ *G01R 29/0885* (2013.01)
(58) Field of Classification Search
CPC .......................... G01R 29/0885; G01R 29/0878
USPC .......................................................... 324/149
See application file for complete search history.

(56) References Cited

U.S. PATENT DOCUMENTS

| | | | | |
|---|---|---|---|---|
| 5,220,328 | A | * | 6/1993 | Jehle ........................ G01S 13/86 342/21 |
| 9,970,973 | B2 | | 5/2018 | Anderson et al. |

| | | | |
|---|---|---|---|
| 10,823,775 | B2 | 11/2020 | Anderson et al. |
| 11,137,432 | B1 | 10/2021 | Armaloo et al. |
| 11,360,135 | B2 | 6/2022 | Anderson et al. |
| 11,598,798 | B1 | 3/2023 | Bucklew et al. |
| 11,815,538 | B2 | 11/2023 | Bucklew et al. |
| 2018/0373118 | A1 * | 12/2018 | Kiffner ................... G02F 1/353 |
| 2020/0136727 | A1 | 4/2020 | Graceffo et al. |
| 2020/0292606 | A1 | 9/2020 | Holloway et al. |
| 2020/0295838 | A1 | 9/2020 | Gordon et al. |
| 2021/0285993 | A1 | 9/2021 | Armaloo et al. |
| 2023/0058843 | A1 * | 2/2023 | Bucklew ............ G01R 29/0878 |
| 2023/0243881 | A1 | 8/2023 | Anderson et al. |
| 2024/0310422 | A1 * | 9/2024 | Moore ............... G01R 29/0878 |

OTHER PUBLICATIONS

Epple et al., "Rydberg Atoms in Hollow-Core Photonic Crystal Fibres," Nature Communications; 5:4132; Published Jun. 19, 2014; pp. 1-5.
Knarr et al., "Spatiotemporal Multiplexed Rydberg Receiver," IEEE Transactions on Quantum Engineering; Quantum Sensing and Metrology; Published Sep. 29, 2023; vol. 4; 2023; pp. 1-8.
Langbecker et al., "Rydberg Excitation of Cold Atoms Inside a Hollow Core Fiber," Physical Review A; vol. 96, Issue 4; Published Oct. 4, 2017; pp. 1-7.

(Continued)

*Primary Examiner* — Christopher P McAndrew
(74) *Attorney, Agent, or Firm* — ALLEN, DYER, DOPPELT, + GILCHRIST, P.A.

(57) ABSTRACT

A Rydberg sensor may include Rydberg sensing regions, a coupling laser source, and an optical path extending from the coupling laser source to feed the plurality of Rydberg sensing regions in a series configuration. A probe source generates respective probe laser beams for the Rydberg sensing regions.

28 Claims, 8 Drawing Sheets

(56)     References Cited

OTHER PUBLICATIONS

Meyer et al., "Assessment of Rydberg Atoms for Wideband Electric Field Sensing," Journal of Physics B: Atomic, Molecular and Optical Physics; vol. 53, No. 3; Published Jan. 10, 2020; 17 pages.
Simons et al., "Fiber-Coupled Vapor Cell for a Portable Rydberg Atom-Based Radio Frequency Electric Field Sensor," Applied Optics; vol. 57, No. 22; Aug. 1, 2018; pp. 6456-6460.
Veit et al., "RF-Dressed Rydberg Atoms in Hollow-Core Fibres," Journal of Physics B: Atomic, Molecular and Optical Physics; vol. 49, No. 13; Published Jun. 8, 2016; 7 pages.
U.S. Appl. No. 18/187,783, filed Mar. 22, 2023 Inventors: Victor G. Bucklew et al.

* cited by examiner

RYDBERG SENSOR HAVING AN OPTICAL FIBER PATH FEEDING RYDBERG SENSING REGIONS AND ASSOCIATED METHODS

FIELD OF THE INVENTION

The present invention relates to Rydberg sensors, and more particularly, to a Rydberg sensor having a plurality of Rydberg sensing regions and related methods.

BACKGROUND OF THE INVENTION

Radio frequency (RF) signals are generated and received in communications and sensing applications across a wide range of commercial markets and government divisions. Emerging RF applications are pushing technical requirements to higher frequency ranges with new waveforms that may be difficult to detect and need RF receivers or sensors having increased sensitivity. As conventional RF channels become more heavily crowded, there is a need to use alternative RF bands spanning from tens of KHz to 300 MHz and beyond. While some RF receivers and sensors span multiple bands, most are band-limited and can cover only a few tens of GHz, with a typical upper limit of about 40 GHz, e.g., the Ka band. Also, some state-of-the-art RF receivers and sensors are not compatible with new waveforms used in emerging distributed sensing networks and new RF applications that are sensitivity limited, or not served with existing narrow band antenna-based RF receivers and sensors.

Conventional RF devices that incorporate RF antennas may have a high technology readiness level (TRL) and are used in almost every modern RF sensing or communications system. There are limitations with RF antennas, however, because they are Size, Weight and Power (SWaP) limited. The antenna is also on the order of the RF wavelength of radiation, and the RF coverage is over a relatively narrow frequency band, such as 1-10 GHZ or 20-40 GHz. Many conventional RF devices employ antenna designs that are not compatible with emerging waveforms and may lack sensitivity, making them difficult to cover wide bandwidths, such as tens of KHz to 300 MHZ with high sensitivity.

To address these limitations, Rydberg atom-based RF sensors have been developed, which convert the response of an atomic vapor to incoming RF radiation into measurable changes in an optical probe. These RF sensors provide a new model for RF sensing with increased sensitivity. For example, conventional antennas may provide at most about −130 to −160 dBi (decibels relative to an isotropic radiator), but with Rydberg system sensitivity, it can be up to about −200 dBi with a broader range coverage in a single receiver from KHz to THz.

In a Rydberg atom-based RF sensor, the measurement is based upon the attenuation of a probe laser due to absorption in a small room temperature vapor cell filled with alkali atoms, such as rubidium (Rb) or cesium (Cs). In a 2-photon/laser Rydberg sensing system, atoms are simultaneously excited into a "Rydberg" state with both a coupling laser and probe laser. These Rydberg states are very responsive to local electric fields and the response of the atom to an external electric field, such as an RF signal, alters the measured attenuation of the probe laser, which may be detected by a probe laser photo detector. The magnitude of the electric field component of the incoming RF radiation and its center frequency detuning from atomic resonance may be determined by measuring the magnitude and asymmetry of spectral splitting of the electromagnetically induced transparency (EIT), which is called Autler-Townes (AT) splitting.

Current Rydberg atom-based RF sensors may have low sampling rates that are set by the slow response time of the atomic system. Current Rydberg atom-based RF sensors also may be limited by their latency, due to the need for scanning the probe laser across the atomic absorption feature. Data speeds may also be limited by atomic relaxation times to a few megahertz and need time-consuming probe scanning protocols to extract relevant spectroscopic features. The response speed of some Rydberg sensors has been predicted to reach greater than 100 MHz, but these designs may be limited because of their large size and weight and may require complex space beam steering optics and mounts.

SUMMARY OF THE INVENTION

In general, a Rydberg sensor may comprise a plurality of Rydberg sensing regions and a coupling laser source. An optical path may extend from the coupling laser source to feed the plurality of Rydberg sensing regions in a series configuration. A probe source may be configured to generate a plurality of respective probe laser beams for the plurality of Rydberg sensing regions.

The optical path may comprise at least one optical fiber segment. Adjacent ones of the plurality of Rydberg sensing regions may be arranged in side-by-side relation. The plurality of Rydberg sensing regions may comprise a plurality of hollow core fiber Rydberg sensing regions. The plurality of Rydberg sensing regions may comprise a plurality of individual Rydberg sensing gas cells. A detector may be downstream from the plurality of Rydberg sensing regions. A lens may be between the plurality of Rydberg sensing regions and the detector. An optical combiner may be between the plurality of Rydberg sensing regions and the detector. A plurality of respective different optical delay elements may be between the probe source and the plurality of Rydberg sensing regions. The optical fiber path may comprise a plurality of optical fibers and a plurality of wavelength division multiplexers associated therewith.

Another aspect is directed to a method of making a Rydberg sensor that may comprise extending an optical path from a coupling laser source to feed a plurality of Rydberg sensing regions in a series configuration. The method may further include mounting a probe source to generate a plurality of respective probe laser beams for the plurality of Rydberg sensing regions.

BRIEF DESCRIPTION OF THE DRAWINGS

Other objects, features and advantages of the present invention will become apparent from the detailed description of the invention which follows, when considered in light of the accompanying drawings in which.

DETAILED DESCRIPTION

The present description is made with reference to the accompanying drawings, in which exemplary embodiments are shown. However, many different embodiments may be used, and thus, the description should not be construed as limited to the particular embodiments set forth herein. Rather, these embodiments are provided so that this disclosure will be thorough and complete. Like numbers refer to like elements throughout.

Figure 1:
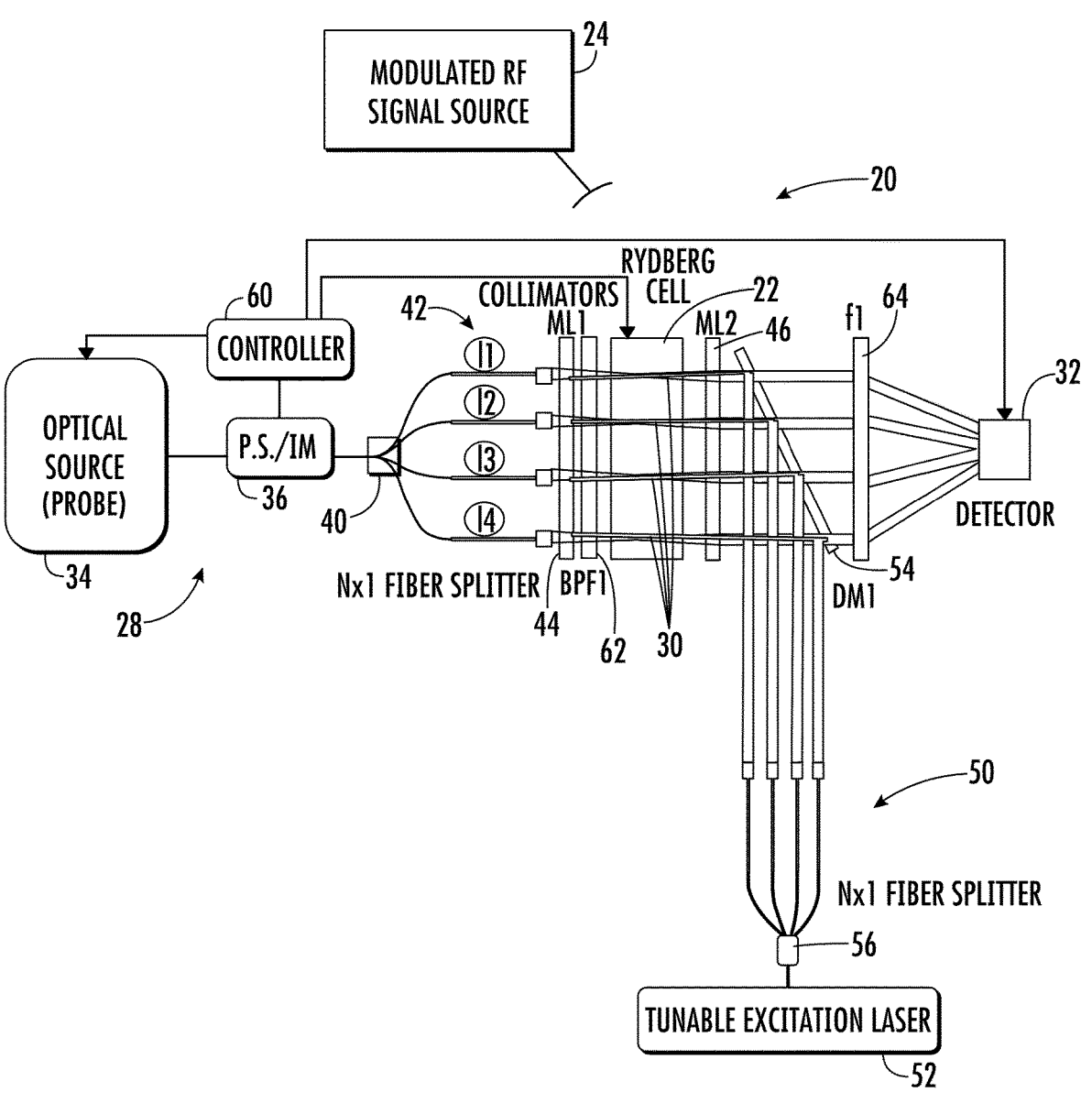
FIG. 1 is a schematic diagram of a known Rydberg sensor that uses Spatiotemporal Multiplexing (STM).
Figure 2:
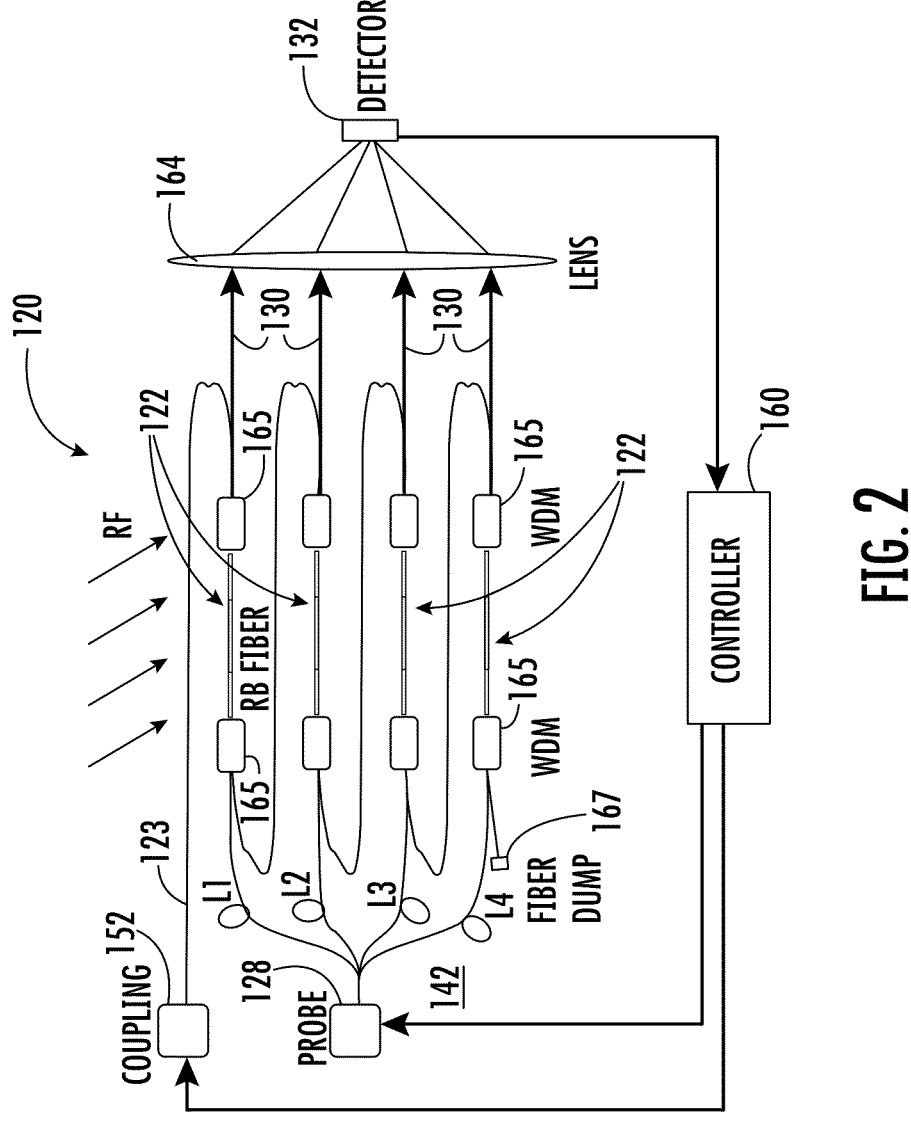
FIG. 2 is a schematic diagram of the Rydberg sensor that includes an optical path formed by at least one optical fiber segment feeding Rydberg sensing regions according to the invention.
Figure 3:
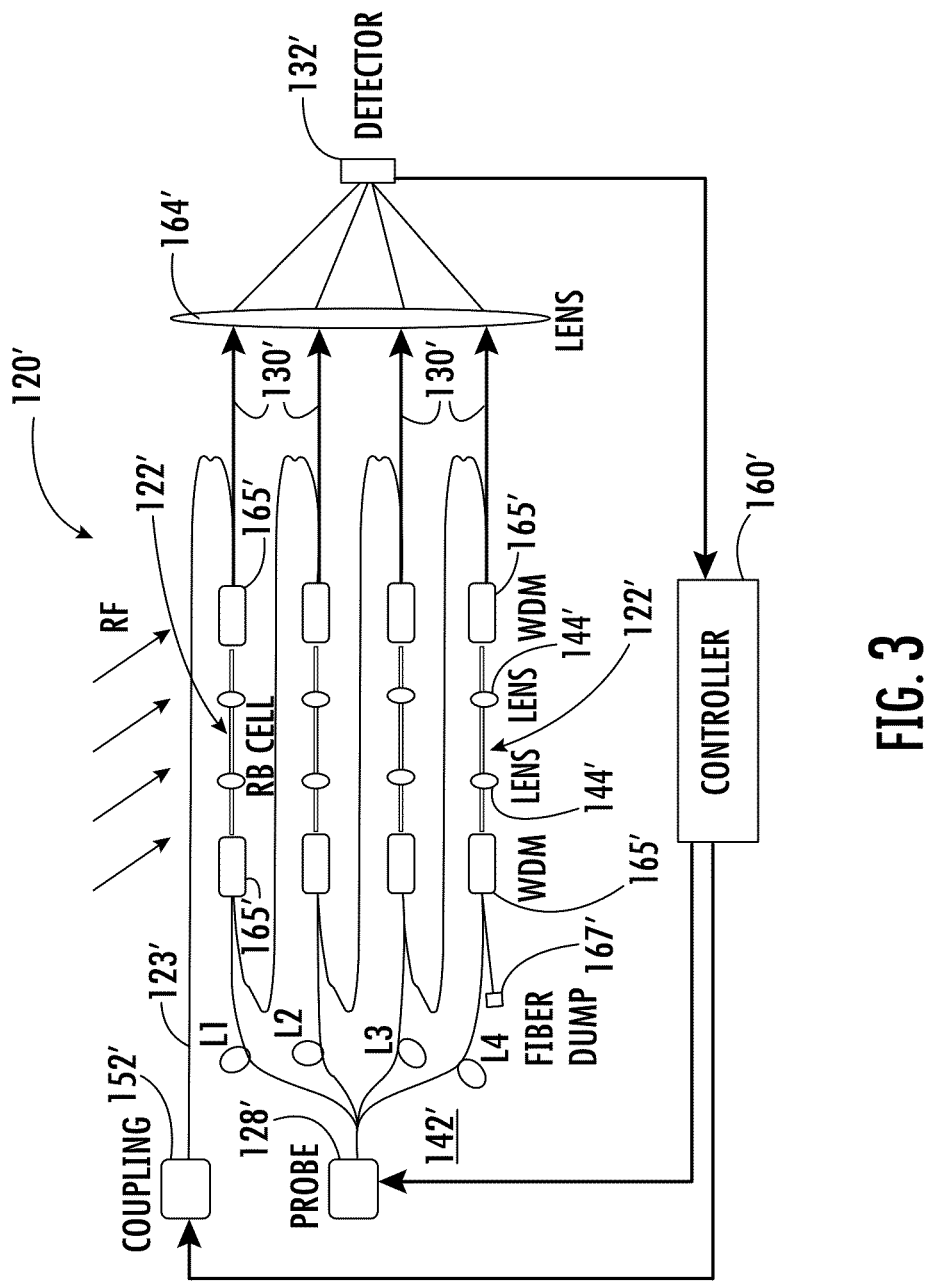
FIG. 3 is a second embodiment of the Rydberg sensor according to the invention.
Figure 4:
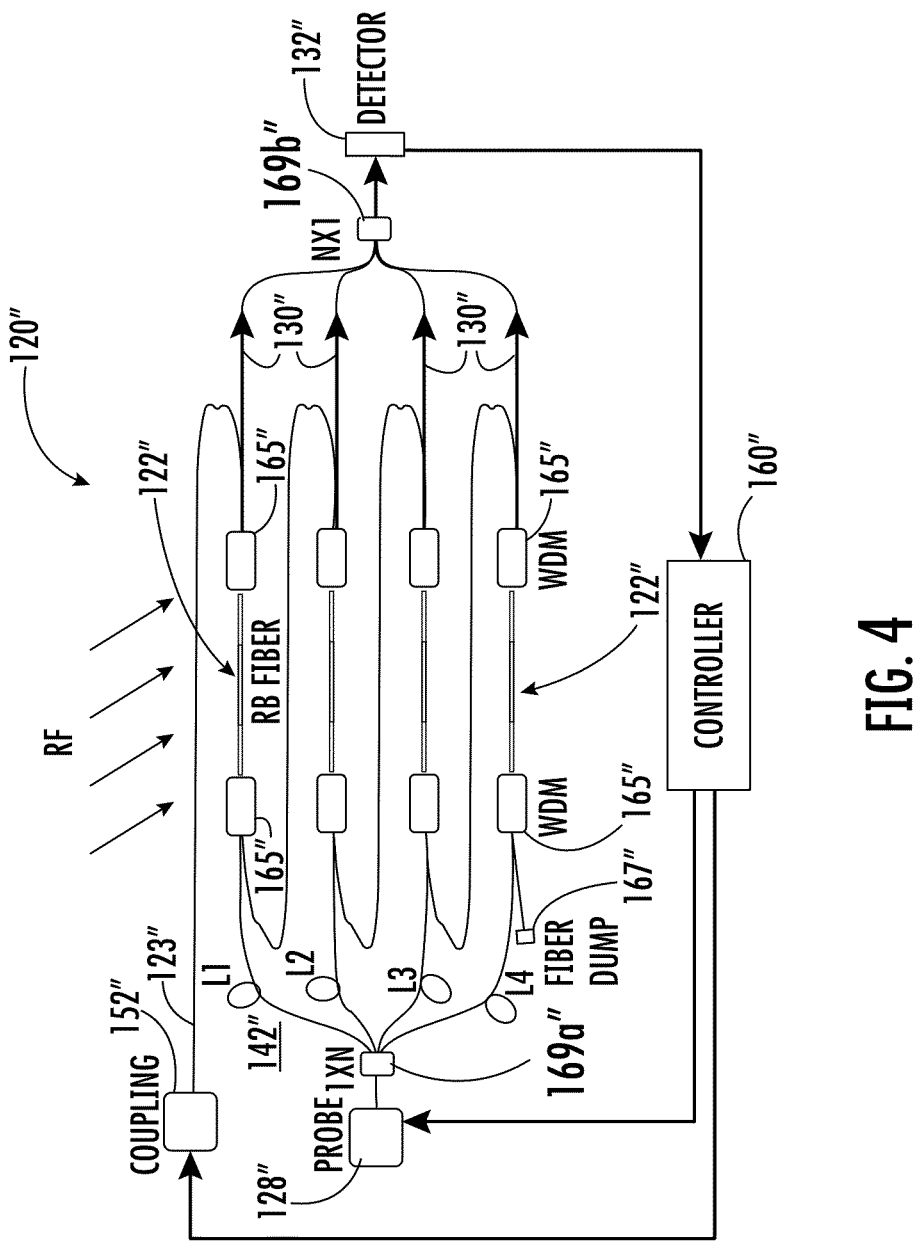
FIG. 4 is a third embodiment of the Rydberg sensor according to the invention.

There now follows a description of a known Rydberg sensor receiver that operates as a Spatiotemporal Multiplexing (STM) Rydberg sensor receiver for high data sampling rate as explained relative to FIG. 1, followed by the fiber coupled approach for the Rydberg sensor according to the invention as explained relative to the embodiments of FIGS. 2-4.

Referring to FIG. 1, a known Spatiotemporal Multiplexing (STM) Rydberg sensor, also referred to as a Rydberg sensor receiver, is illustrated generally at 20 and includes a Rydberg cell 22 that is configured to be exposed to a radio frequency (RF) signal generated from a modulated RF signal source 24. This RF signal source 24 may include a non-modulated RF local oscillator. A probe source indicated generally at 28 is configured to generate a plurality of spaced apart pulsed probe beams within the Rydberg cell 22 and generally shown at 30, with the pulsed probe beams being offset in time from one another. It should be understood that one or more Rydberg cells may be used with the probe beams in multiple Rydberg cells. A detector 32 is positioned downstream from the Rydberg cell 22. In an example, the detector 32 is formed from a photodetector cell. The probe source 28 is configured to generate the plurality of spaced apart pulsed probe beams 30 in an example without scanning and may be formed as an optical source 34 with a pulse shaper 36 that is downstream from the optical source. The Rydberg sensor receiver 20 may work with and without scanning the probe beam. The pulse shaper 36 may be an intensity modulator.

In an example, the probe source 28 includes a beam splitter 40, such as a N×1 fiber splitter, downstream from the pulse shaper 36 and a respective optical delay element 42 in a path of each beam downstream from the beam splitter. In a non-limiting example, each optical delay element 42 may be formed as a respective different length of optical fiber shown by the loops indicated as L1, L2, L3 and L4. Other delay mechanisms may be used besides fixed pulse delays, such as a free space delay elements. In another non-limiting example, a first microlens 44 is positioned adjacent a first side of the Rydberg cell 22 and a second microlens 46 is positioned adjacent a second side of the Rydberg cell as illustrated by the designations ML1 and ML2.

An excitation source 50 as a coupling laser is coupled to the Rydberg cell 22 and formed, in an example, as a tunable excitation laser 52 and at least one mirror 54, such as a dichroic mirror downstream therefrom to input the output of the excitation laser and excite the rubidium or cesium used within the Rydberg cell 22. For a 4-beam version, as shown in FIG. 1, the Nχ1 fiber splitter 56 is a 4×1 splitter and may split the output into four beams from the excitation laser 50 corresponding to the illustrated four probe beams 30. A controller 60 is coupled to the Rydberg cell 22, the optical source 34 as the laser probe of the probe source 28 and detector 32. The delay mechanism may not only delay tunability as noted above, but also direct modulation temporal gating of one or more excitation lasers 52.

As illustrated, a bandpass filter (BPF1) 62 may be included to block the excitation laser 52 and pass the spaced apart probe beams 30. This component may be a wavelength division multiplexer or a dichroic mirror. A plano convex lens (f1) 64 may focus the probe beams 30 to the detector 32. The first microlens 44 and bandpass filter 62 may be formed as a collimator device, e.g., a Thorlabs Part No. 50-780, and have a collimator output with about a 0.5 mm spot size beam at 780 nanometers as generated from the optical source 34 as a laser.

In an example, the Rydberg cell 22 is a rubidium Rydberg cell, such as Thorlabs part no. GC19075-RB. Other vapors of specific atomic elements may include Cesium (Cs), Potassium (K), Sodium (Na), and possibly Iodine (I). The Rydberg sensor receiver 20 as illustrated will temporally and spectrally shape the signature of the pulsed probe beams 30, and thus, allows an increase in the sampling rate as proportional to the number of beams "N." Increasing the sampling rate is also dependent on the probe repetition rate. Separating the probe source 28 as a probe laser beam into N distinct pulses, each of which interrogates a distinct volume of the Rydberg cell 22, will increase the sampling of an incoming RF field in proportion to the number of beams "N." In addition to increasing the sampling rate, the bandwidth of the probe pulses may also help reduce the latency usually incurred by scanning the probe beam across the EIT spectrum. This may reduce the latency from about 1 to 2 orders of magnitude. The temporal pulse width of the probe determines its spectral bandwidth through a Fourier transform.

It is possible to increase the probe bandwidth generated from the optical source 34 from about 100 KHz to about 200 MHz by choosing an appropriate pulse width. The incoming RF field may be mapped onto a spectroscopic fingerprint without scanning. The Rydberg sensor receiver 20 captures a response directly correlated to the integrated line absorption spectrum, i.e., the equivalent width for the case of the spectral character of the source propagating through the atomic vapor at/near the frequency of an atomic absorption line modified by the pressure of EIT. Further details of the Rydberg sensor 20 described in FIG. 1 are explained in U.S. Pat. No. 11,598,798 to Bucklew et al., assigned to Eagle Technology, LLC, the disclosure which is hereby incorporated by reference in its entirety.

As will be explained with reference to embodiments shown in FIGS. 2-4, the Rydberg sensor receiver may include fiber-coupled compact Rydberg cells, such as hollow-core gas filled fibers, fiber coupled bulk Rydberg cells, or free space compact Rydberg cells that are series coupled as Rydberg sensing regions that reduce the Rydberg sensor receiver Size, Weight and Power (SWaP) and allow an all-fiber Rydberg sensor receiver. In this example, the fiber coupled Rydberg cells or fibers are arrayed in a Spatiotemporal Multiplexing configuration, where the coupling laser is recycled via an optical path formed in this example by at least one optical fiber segment that extends from the coupling laser source to feed a plurality of Rydberg sensing regions in a series configuration. Thus, the Size, Weight and Power of the coupling laser and its operating requirements are reduced. This configuration overcomes the previous efforts to recycle the coupling laser into a single path of a Rydberg sensing region or cell because of constrained data sampling rates inherent to continuous wave pumping of a single Rydberg cell.

Similar components and elements for the Rydberg sensor 120, 120', 120" embodiments, according to the invention described relative to FIGS. 2-4, are given common reference numerals in the 100 series. The reference numerals in the second embodiment of the Rydberg sensor 120' of FIG. 3 are given a first prime notation, and the reference numerals in the third embodiment of the Rydberg sensor 120" of FIG. 4 are given the double prime notation.

As shown in FIG. 2, the Rydberg sensor 120, according to a first embodiment, includes a plurality of Rydberg sensing regions 122 with adjacent ones of the Rydberg sensing regions arranged in side-by-side relation. In this embodiment shown in FIG. 2, the plurality of Rydberg sensing regions 122 are formed as a plurality of hollow core fiber Rydberg sensing regions. As illustrated, an optical path 123 is formed by at least one optical fiber segment that extends from the coupling laser source 152 to feed the plurality of Rydberg sensing regions 122 in a series configuration. A probe source 128 is configured to generate a plurality of respective probe laser beams 130 for the plurality of Rydberg sensing regions 122. A plurality of respective different optical delay elements 142 are between the probe source 128 and the plurality of Rydberg sensing regions 122, such as respective different lengths of optical fiber shown by the loops indicated by L1, L2, L3, and L4. Similar to the Rydberg sensor receiver 20 described relative to FIG. 1, other delay mechanisms may be used beside fixed pulse delays, such as free space delay elements.

A detector 132 is positioned downstream from the plurality of the Rydberg sensing regions 122. A lens 164, such as a plano convex lens, is between the plurality of Rydberg sensing regions and the detector. Similar to the example of FIG. 1, the detector 132 may be formed as a photo detector cell. The optical fiber path 123 that extends from the coupling laser source 152 to feed the plurality of Rydberg sensing regions 122 in a series configuration may include a plurality of optical fibers and a plurality of wavelength division multiplexers 165 associated therewith. These wavelength division multiplexers 165 permit the laser beams from the probe laser source 128 to be passed through the Rydberg sensing regions 122 and allows the laser beam from the coupling laser source 152 to be joined together with the probe 128 laser beams. The optical fiber path 123 that begins at the coupling laser source 152 extends to feed the plurality of Rydberg sensing regions 122 in a series configuration and ends in a fiber dump 167. A controller 160 may cooperate with the different components as illustrated in FIG. 2, including the coupling laser source 152, probe laser source 128, and detector 132. The controller 160 may connect to other components depending on design, including the Rydberg sensing regions 122.

In the second embodiment of the Rydberg sensor 120' shown in FIG. 3, the Rydberg sensing regions 122' are formed as a plurality of individual Rydberg sensing gas cells. An optical microlens 144' may be positioned on either side of each Rydberg sensing region 122' formed as a Rydberg sensing gas cell to allow fiber-coupling to and from the Rydberg sensing gas cell. Other components such as the controller 160', WDMs 165', lens 164' detector 132', fiber dump 167', coupling and probe laser sources 152', 128', optical delay elements 142', and optical fiber path 123' may be similarly formed as components in FIG. 2.

It is also possible to substitute an optical splitter 169a" and combiner 169b" for the lens 164, 164' (FIGS. 2 and 3) as shown in the third embodiment of the Rydberg sensor 120" in FIG. 4, where the optical combiner is between the plurality of Rydberg sensing regions 122" and the detector 132". The Rydberg sensing regions 122" in this embodiment are formed as hollow core fiber Rydberg sensing regions. Since a lens 164, 164' as shown in the first and second embodiments of the Rydberg sensor 120,120' in FIGS. 2 and 3 is not used, the embodiment of the Rydberg sensor 120" in FIG. 3 is the smallest in footprint. Other components may be similarly formed as components in FIG. 2.

Figure 5A:
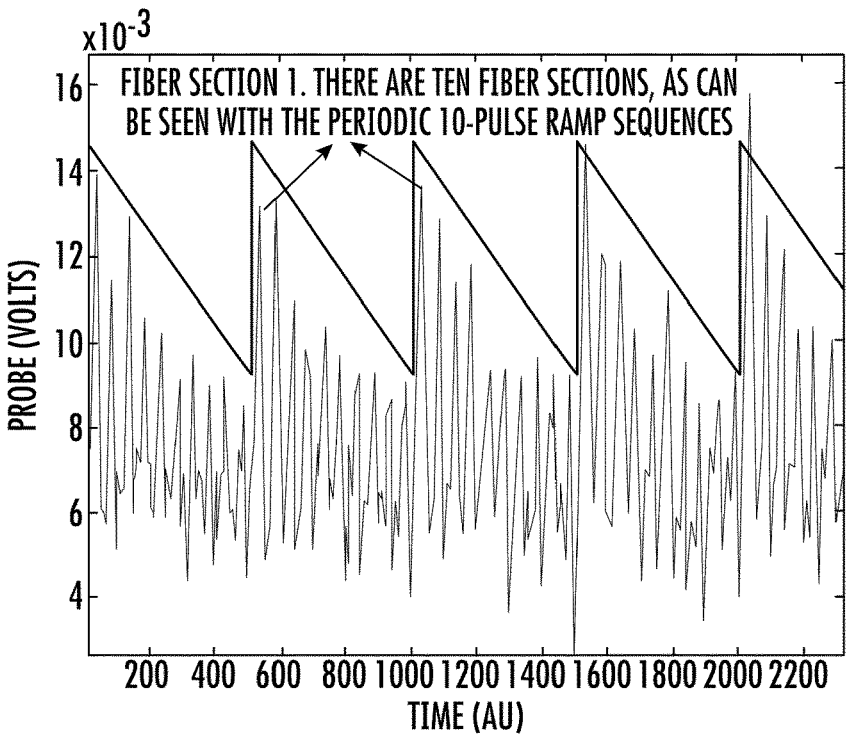
FIG. 5A is a graph showing the 20 MHz data sampling rate of the Rydberg sensor of FIG. 4 when there is no incoming RF signal.
Figure 5B:
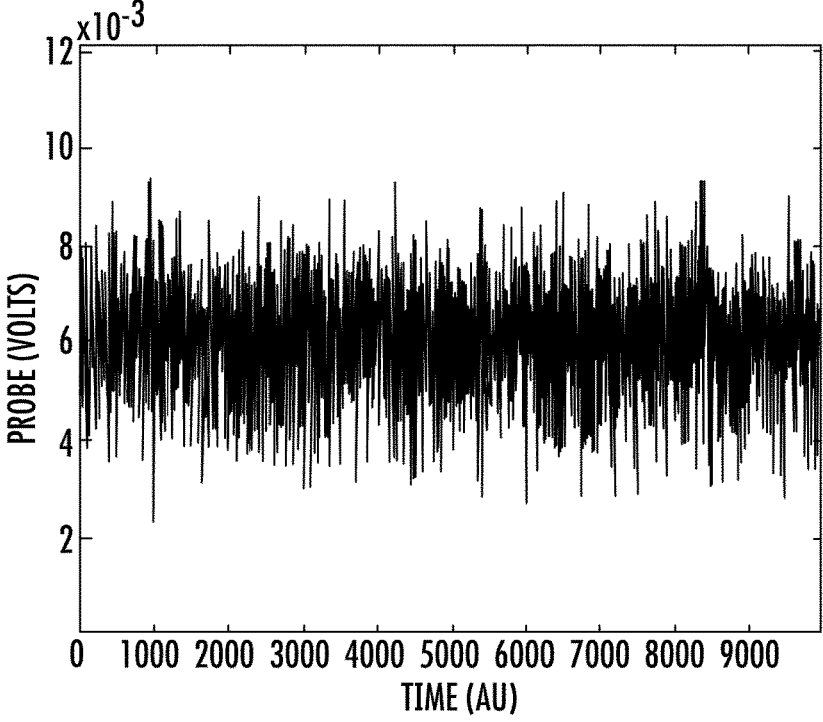
FIG. 5B is a graph showing the 20 MHz data sampling rate of the Rydberg sensor of FIG. 4 when there is an incoming RF signal.

The incorporation of an optical fiber 123, 123', 123" path that extends from the coupling laser source 152, 152', 152" to feed the plurality of Rydberg sensing regions 122, 122', 122" in a series configuration leads to a ramp in the detected probe voltage as the coupling power is reduced each time it passes through a Rydberg sensing region. Time bins periodically correlate with the Rydberg sensing regions 122, 122' 122" and can be mapped to unique voltages for thresholding purposes. Even without thresholding, the on/off states of the Rydberg sensors 120, 120', 120" are discernible, regardless of which Rydberg sensing region 122, 122', 122" is being evaluated as shown in the comparison graphs of FIGS. 5A and 5B, where an all-fiber 20 MHz data sampling rate for the Rydberg sensor 120" as shown in the embodiment of FIG. 4 is illustrated. In the graph of FIG. 5A, no radio frequency for the Rydberg sensor 120" is received, and thus, the RF is "off." In the graph of FIG. 5B, the radio frequency is received, and thus, the RF is "on." As shown in the graph of FIG. 5A, there are ten fiber sections, which are evident with the periodic 10-pulse ramp sequences. The number of fiber sections can vary depending on the design and end-use requirements.

Figure 6A:
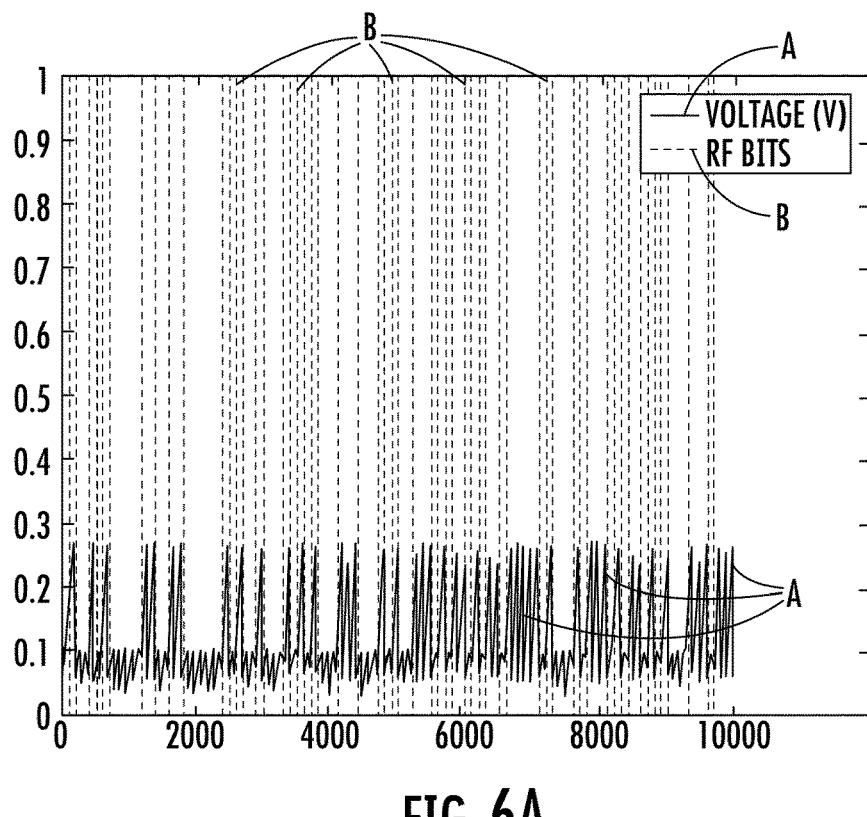
FIG. 6A is a graph showing a 10 MHz data sampling rate and 2 MHz repetition rate for the Rydberg sensor of FIG. 1.
Figure 6B:
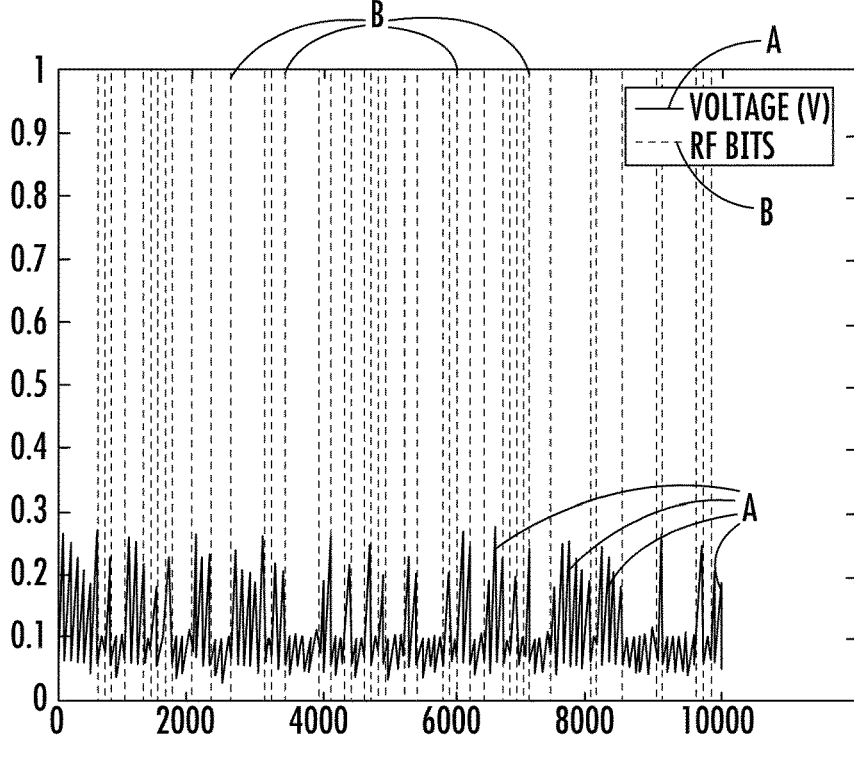
FIG. 6B is a graph showing the 10 MHz data sampling rate and 2 MHz repetition rate for the Rydberg sensor of FIG. 2 according to the invention.

The graphs of FIGS. 6A and 6B are a comparison illustrating a 10 MHz data sampling rate with a 2 MHz repetition rate for demodulating an on-off keying (OOK) RF bitstream and accurately tracing the RF on/off states. FIG. 6A is a graph showing the results using the sensor receiver 20 of FIG. 1. The graph in FIG. 6B shows the results using the Rydberg sensor 120" of FIG. 4. Both graphs for the sensor receiver 20 of FIG. 1 (FIG. 6A), and the Rydberg sensor 120" of FIG. 4 (FIG. 6B), show that the on-off keyed (OOK) RF bitstream can be demodulated, and the RF on/off states may be traced.

Figure 7A:
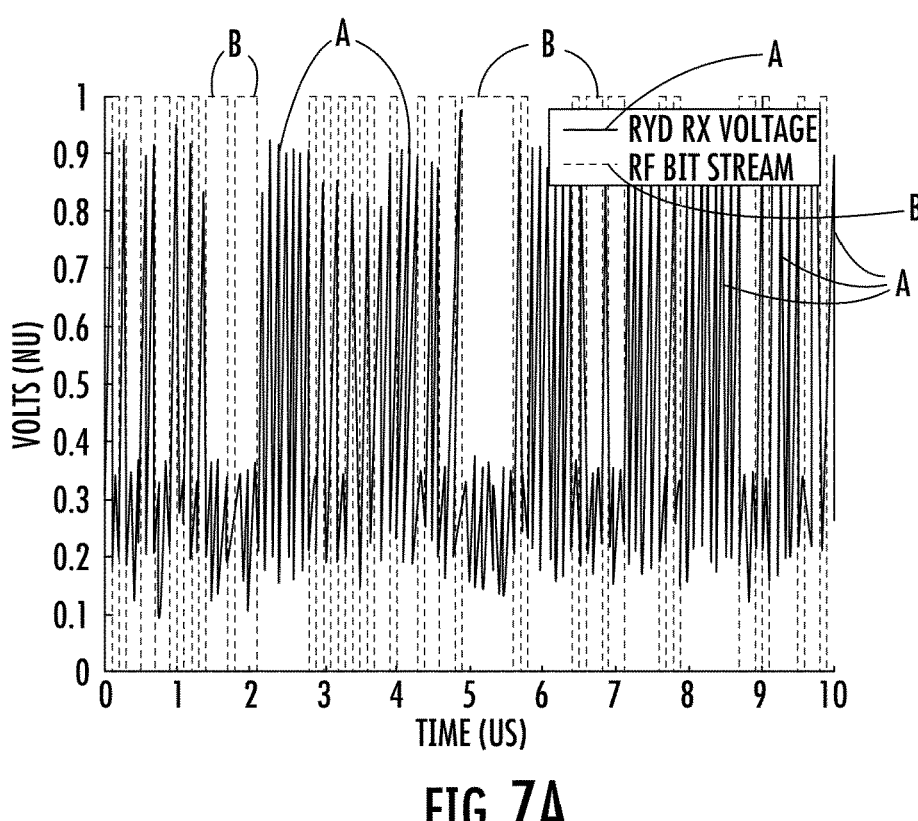
FIG. 7A is a graph showing a 10 MHz data sampling rate and detecting a 10 Mbps, on-off keyed (OOK) RF waveform using the Rydberg sensor of FIG. 1.
Figure 7B:
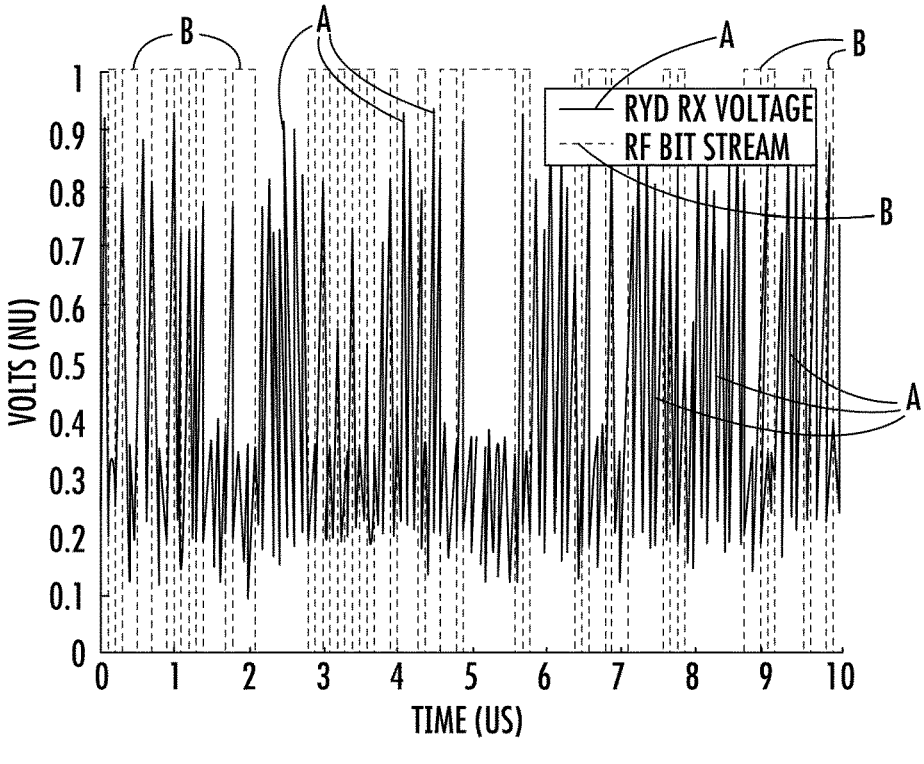
FIG. 7B is a graph showing a 10 MHz data sampling rate and detecting 10 Mbps OOK RF waveform using the Rydberg sensor of FIG. 2 according to the invention.

The graphs of FIGS. 7A and 7B similarly show the demodulation of an OOK RF bitstream, but show a 10 MHz data sampling rate and detecting 10 megabits per second OOK RF waveform with a transmission over 100 bits. FIG. 7A is a graph showing the results from using the sensor receiver 20 shown in FIG. 1, and the graph of FIG. 7B shows the results from the Rydberg sensor 120" of FIG. 4.

The Rydberg sensing regions 122, 122" configured as the hollow core fiber Rydberg sensing regions (FIGS. 2 and 4) may be formed in an example as a hollow-core photonic crystal 125 microns, single mode fiber, or a fiber with a core diameter of about 60 microns, and a mode field diameter of about 42 microns. The lengths can vary depending on particular RF sensing needs, but can range from about 5 centimeters to about 15 centimeters and in an example, average about 10 centimeters. In another example, the hollow core fiber Rydberg sensing regions 122, 122″ may be formed as a vapor-filled Kagome-type hollow-core photonic crystal fiber, which confines both excitation light and atoms. The Rydberg sensing regions 122′ formed as individual Rydberg sensing gas cells (FIG. 3) may be smaller cells containing cesium atoms or similar atoms inside a cubic glass vapor cell with 10 millimeter sides and 1 millimeter thick walls in an example. In another example, it may be about 2 centimeters per side of the housing with optical leads.

In another example, the Rydberg sensor 120″ in the embodiment of FIG. 4 may be reduced in size and weight by about eight (8) times as compared to the Rydberg sensor receiver 20 of FIG. 1. The Rydberg sensor receiver 20 shown in FIG. 1 may be contained in a housing that is about 22 inches by 16 inches by 4 inches, while an example Rydberg sensor 120″ as shown in FIG. 4 may be contained in the housing that is about 5 inches by 7 inches by 1.3 inches.

Figure 8:
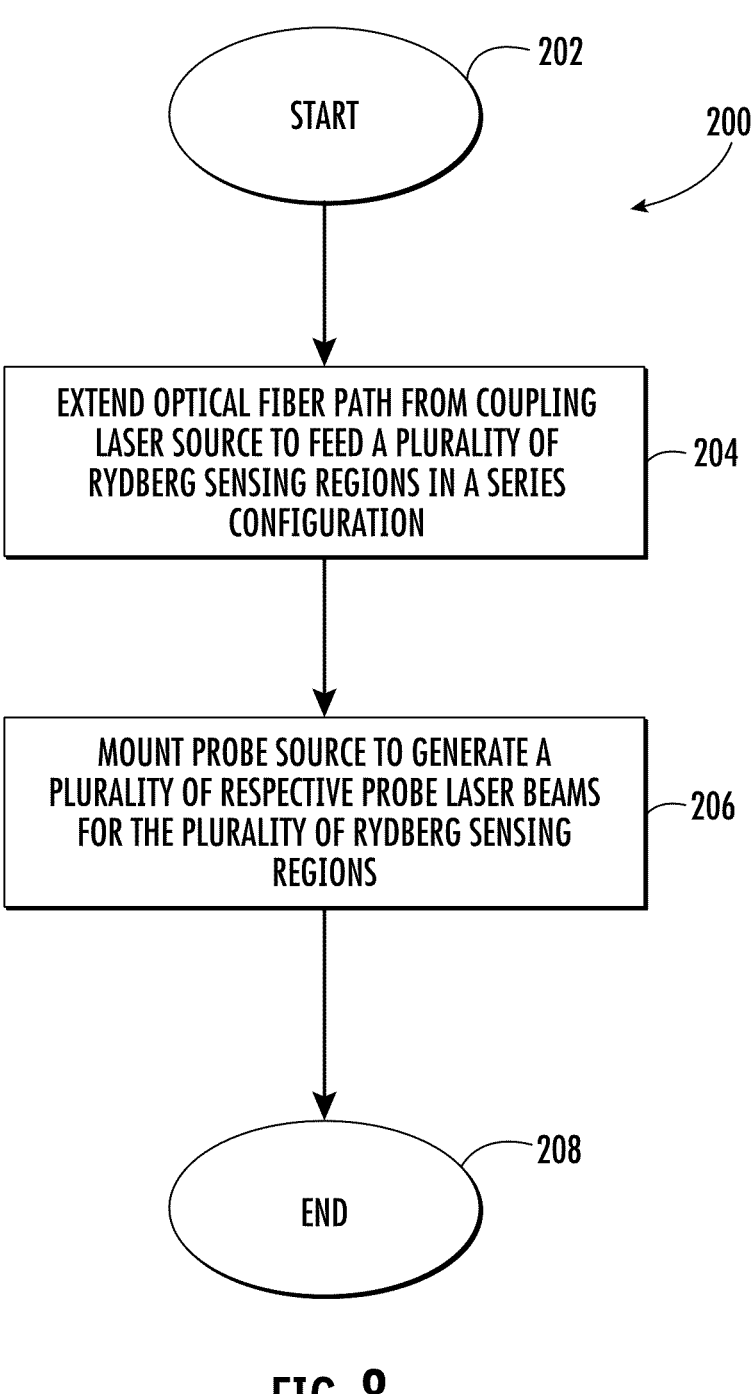
FIG. 8 is a high-level flowchart of a method for making the Rydberg sensor of FIG. 2.

Referring now to FIG. 8, there is illustrated generally at 200 a flowchart showing an example method of making the Rydberg sensor 120, 120′, 120″.

The process starts (Block 202) by extending an optical fiber path 123, 123′, 123″ from a coupling laser source 152, 152′, 152″ to feed a plurality of Rydberg sensing regions 122, 122′, 122″ in a series configuration (Block 204). The method further includes mounting a probe source 128, 128′, 128″ to generate a plurality of respective probe laser beams 130, 130′, 130″ for the plurality of Rydberg sensing regions 122, 122′, 122″ (Block 206). The process ends (Block 208).

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

The invention claimed is:

1. A Rydberg sensor comprising:
a plurality of Rydberg sensing regions;
a coupling laser source;
an optical path extending from the coupling laser source to feed the plurality of Rydberg sensing regions in a series configuration; and
a probe source configured to generate a plurality of respective probe laser beams for the plurality of Rydberg sensing regions.

2. The Rydberg sensor of claim 1 wherein the optical path comprises at least one optical fiber segment.

3. The Rydberg sensor of claim 1 wherein adjacent ones of the plurality of Rydberg sensing regions are arranged in side-by-side relation.

4. The Rydberg sensor of claim 1 wherein the plurality of Rydberg sensing regions comprises a plurality of hollow core fiber Rydberg sensing regions.

5. The Rydberg sensor of claim 1 wherein the plurality of Rydberg sensing regions comprises a plurality of individual Rydberg sensing gas cells.

6. The Rydberg sensor of claim 1 comprising a detector downstream from the plurality of Rydberg sensing regions.

7. The Rydberg sensor of claim 6 comprising a lens between the plurality of Rydberg sensing regions and the detector.

8. The Rydberg sensor of claim 6 comprising an optical combiner between the plurality of Rydberg sensing regions and the detector.

9. The Rydberg sensor of claim 1 comprising a plurality of respective different optical delay elements between the probe source and the plurality of Rydberg sensing regions.

10. The Rydberg sensor of claim 1 wherein the optical path comprises a plurality of optical fibers and a plurality of wavelength division multiplexers associated therewith.

11. A Rydberg sensor comprising:
a plurality of Rydberg sensing regions arranged in side-by-side relation;
a coupling laser source;
an optical path extending from the coupling laser source to feed the plurality of Rydberg sensing regions in a series configuration;
a probe source configured to generate a plurality of respective probe laser beams for the plurality of Rydberg sensing regions; and
a detector downstream from the plurality of Rydberg sensing regions.

12. The Rydberg sensor of claim 11 wherein the optical path comprises at least one optical fiber segment.

13. The Rydberg sensor of claim 11 wherein the plurality of Rydberg sensing regions comprises a plurality of hollow core fiber Rydberg sensing regions.

14. The Rydberg sensor of claim 11 wherein the plurality of Rydberg sensing regions comprises a plurality of individual Rydberg sensing gas cells.

15. The Rydberg sensor of claim 11 comprising a lens between the plurality of Rydberg sensing regions and the detector.

16. The Rydberg sensor of claim 11 comprising an optical combiner between the plurality of Rydberg sensing regions and the detector.

17. The Rydberg sensor of claim 11 comprising a plurality of respective different optical delay elements between the probe source and the plurality of Rydberg sensing regions.

18. The Rydberg sensor of claim 11 wherein the optical path comprises a plurality of optical fibers and a plurality of wavelength division multiplexers associated therewith.

19. A method of making a Rydberg sensor comprising:
extending an optical path from a coupling laser source to feed a plurality of Rydberg sensing regions in a series configuration; and
mounting a probe source to generate a plurality of respective probe laser beams for the plurality of Rydberg sensing regions.

20. The method of claim 19 wherein the optical path comprises at least one optical segment.

21. The method of claim 19 comprising arranging adjacent ones of the plurality of Rydberg sensing regions in side-by-side relation.

22. The method of claim 19 wherein the plurality of Rydberg sensing regions comprises a plurality of hollow core fiber Rydberg sensing regions.

23. The method of claim 19 wherein the plurality of Rydberg sensing regions comprises a plurality of individual Rydberg sensing gas cells.

24. The method of claim 19 comprising mounting a detector downstream from the plurality of Rydberg sensing regions.

25. The method of claim 24 comprising mounting a lens between the plurality of Rydberg sensing regions and the detector.

26. The method of claim 24 comprising mounting an optical combiner between the plurality of Rydberg sensing regions and the detector.

27. The method of claim 19 comprising mounting a plurality of respective different optical delay elements between the probe source and the plurality of Rydberg sensing regions.

28. The method of claim 19 wherein the optical path comprises a plurality of optical fibers and a plurality of wavelength division multiplexers associated therewith.

\* \* \* \* \*